United States Patent
Takeda et al.

(10) Patent No.: US 9,997,374 B2
(45) Date of Patent: Jun. 12, 2018

(54) ETCHING METHOD

(71) Applicant: Tokyo Electron Limited, Tokyo (JP)

(72) Inventors: Ryohei Takeda, Miyagi (JP); Sho Tominaga, Miyagi (JP); Yoshinobu Ooya, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/375,405

(22) Filed: Dec. 12, 2016

(65) Prior Publication Data

US 2017/0178921 A1 Jun. 22, 2017

(30) Foreign Application Priority Data

Dec. 18, 2015 (JP) .................................. 2015-247568
Jun. 1, 2016 (JP) .................................. 2016-110071

(51) Int. Cl.
  *H01L 21/311* (2006.01)
  *H01L 21/02* (2006.01)
  *H01J 37/32* (2006.01)

(52) U.S. Cl.
  CPC .... *H01L 21/31116* (2013.01); *H01J 37/3244* (2013.01); *H01J 37/32165* (2013.01); *H01J 37/32568* (2013.01); *H01J 37/32715* (2013.01); *H01L 21/0217* (2013.01); *H01L 21/02164* (2013.01); *H01J 2237/334* (2013.01)

(58) Field of Classification Search
  None
  See application file for complete search history.

(56) References Cited

U.S. PATENT DOCUMENTS

| 9,384,992 | B2 * | 7/2016 | Narishige | H01L 27/11556 |
| 9,449,838 | B2 * | 9/2016 | Ogawa | H01J 37/32091 |
| 9,735,021 | B2 * | 8/2017 | Sawataishi | H01L 21/3065 |
| 9,793,134 | B2 * | 10/2017 | Saitoh | H01L 21/31116 |
| 2013/0059450 | A1 * | 3/2013 | Le Gouil | H01L 21/3065 438/715 |
| 2014/0370715 | A1 * | 12/2014 | Chung | H01J 37/321 438/714 |

(Continued)

FOREIGN PATENT DOCUMENTS

| JP | S62-050978 | 3/1987 |
| JP | H07-022149 | 1/1995 |

(Continued)

*Primary Examiner* — Allan Olsen
(74) *Attorney, Agent, or Firm* — IPUSA, PLLC

(57) ABSTRACT

An etching method performed by an etching apparatus includes a first process of causing a first high-frequency power supply to output a first high-frequency power with a first frequency and causing a second high-frequency power supply to output a second high-frequency power with a second frequency lower than the first frequency in a cryogenic environment where the temperature of a wafer is −35° C. or lower, to generate plasma from a hydrogen-containing gas and a fluorine-containing gas and to etch, with the plasma, a multi-layer film of silicon dioxide and silicon nitride and a single-layer film of silicon dioxide that are formed on the wafer; and a second process of stopping the output of the second high-frequency power supply. The first process and the second process are repeated multiple times, and the first process is shorter in time than the second process.

12 Claims, 16 Drawing Sheets

(56) References Cited

U.S. PATENT DOCUMENTS

| | | | | |
|---|---|---|---|---|
| 2015/0332932 A1* | 11/2015 | Hirotsu | ............ | H01L 21/31144 |
| | | | | 438/723 |
| 2016/0189975 A1* | 6/2016 | Takeda | .............. | H01L 21/31144 |
| | | | | 438/712 |
| 2016/0293439 A1* | 10/2016 | Saitoh | ............... | H01L 21/31116 |
| 2016/0351407 A1* | 12/2016 | Sawataishi | .......... | H01L 21/3065 |
| 2016/0379856 A1* | 12/2016 | Tomura | ............ | H01L 21/31116 |
| | | | | 438/711 |
| 2017/0110475 A1* | 4/2017 | Liu | .................... | H01L 27/11582 |
| 2017/0229312 A1* | 8/2017 | Park | .................. | H01J 37/32082 |
| 2017/0301579 A1* | 10/2017 | Hosaka | ............ | H01L 21/31116 |
| 2017/0330759 A1* | 11/2017 | Gohira | ................ | H01L 21/3065 |

FOREIGN PATENT DOCUMENTS

| | | |
|---|---|---|
| JP | H07-022393 | 1/1995 |
| JP | 2956524 | 10/1999 |

\* cited by examiner

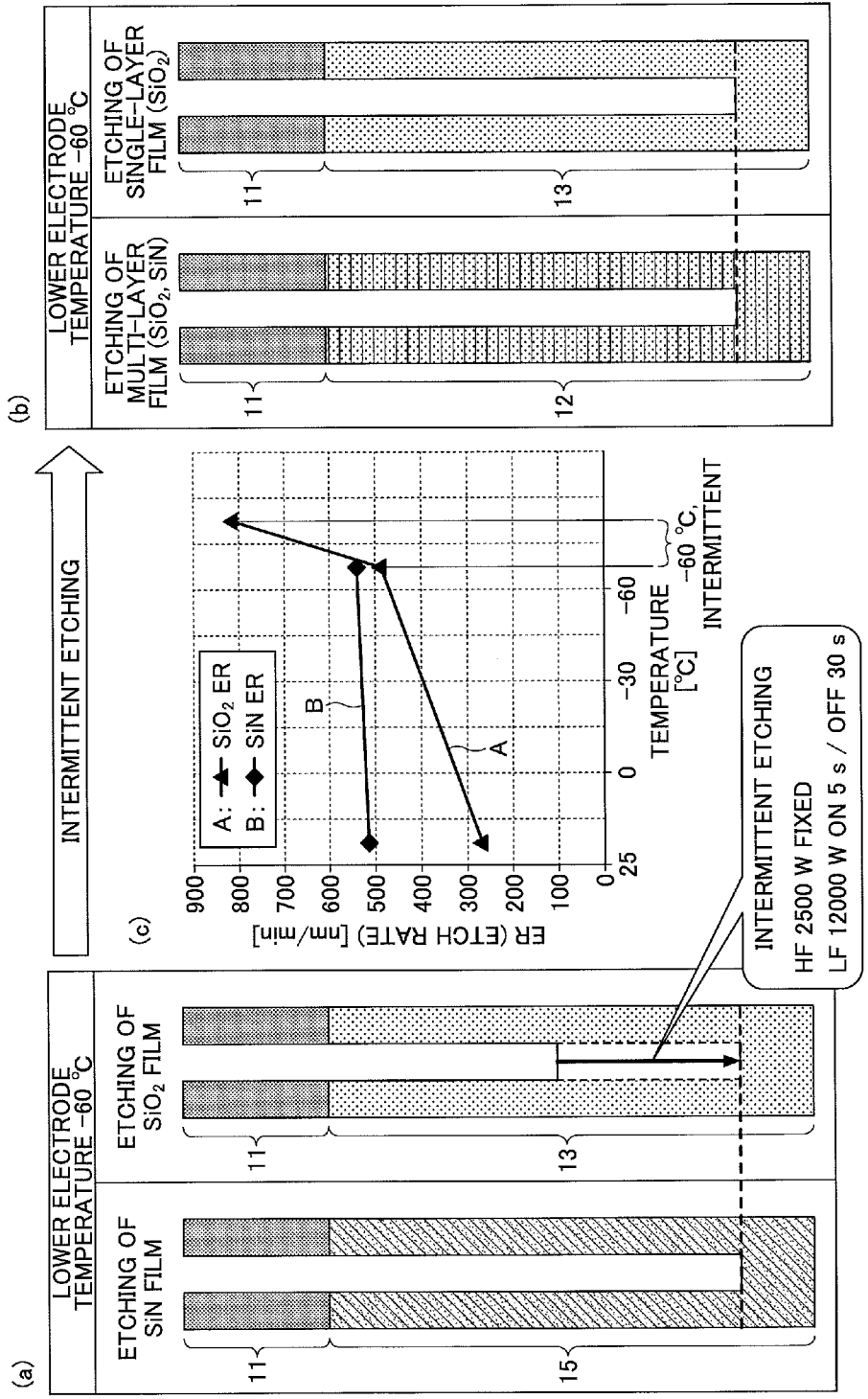

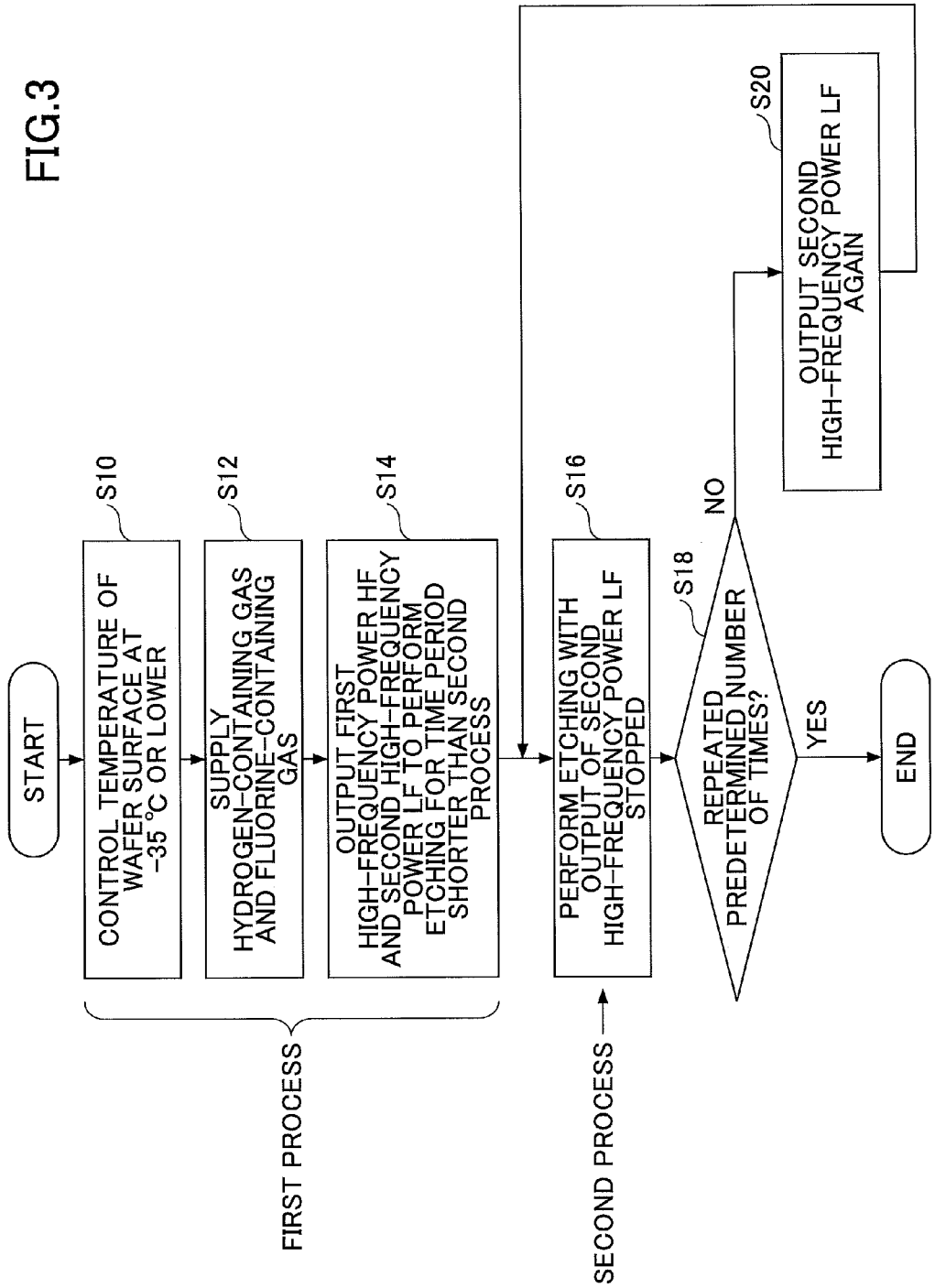

FIG.4B

| No. | LINE | TIME/TEMPERATURE | AT IGNITION | 5 s | 10 s | 20 s | 30 s | 120 s | TEMPER-ATURE INCREASE |
|---|---|---|---|---|---|---|---|---|---|
| | | | | 1st | 2nd | 4th | 6th | 24th | Δ |
| 1 | F | CONTINUOUS 120 s | -65.1 | -43.0 | -40.2 | -36.6 | -35.5 | -33.0 | 32.0 |
| 2 | E | (ON 5 s / OFF 15 s)* 24 TIMES | -65.2 | -43.5 | -42.8 | -42.4 | -42.2 | -40.7 | 24.5 |
| 3 | D | (ON 5 s / OFF 30 s)* 24 TIMES | -64.6 | -43.7 | -43.6 | -43.7 | -43.6 | -43.5 | 21.1 |

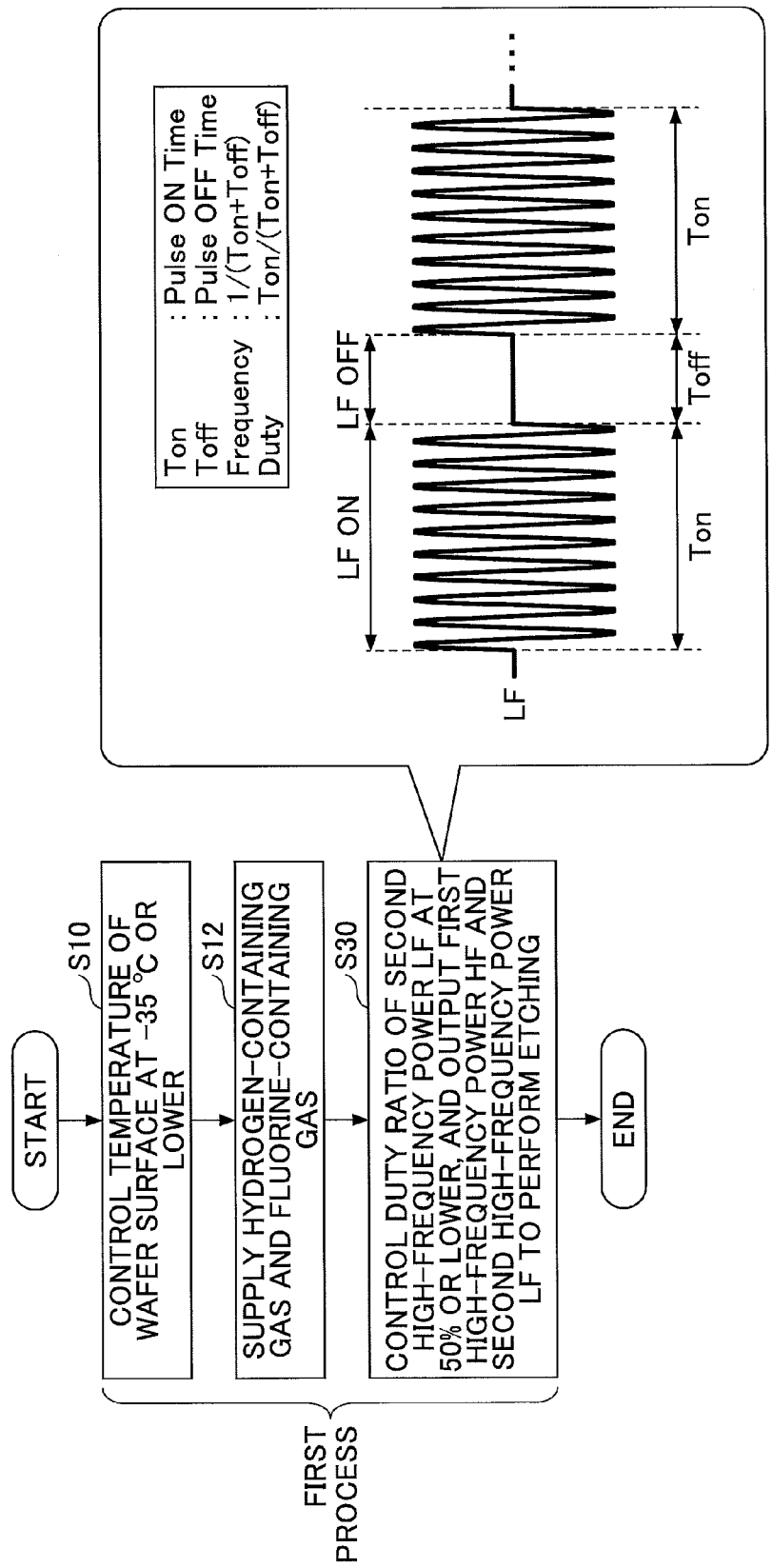

ETCHING METHOD

CROSS-REFERENCE TO RELATED APPLICATIONS

The present application is based upon and claims the benefit of priority of Japanese Patent Application No. 2015-247568 filed on Dec. 18, 2015 and Japanese Patent Application No. 2016-110071 filed on Jun. 1, 2016, the entire contents of which are incorporated herein by reference.

BACKGROUND OF THE INVENTION

1. Field of the Invention

An aspect of this disclosure relates to an etching method.

2. Description of the Related Art

There exists a method where holes with a high aspect ratio are etched in a silicon dioxide film under a low-temperature environment (see, for example, Japanese Laid-Open Patent Publication No. 07-22393). For example, in producing a three-dimensional multilayer semiconductor memory, this method makes it possible to etch holes or grooves with a high aspect ratio in a multi-layer film of silicon dioxide and silicon nitride and in a single-layer film of silicon dioxide.

[Patent document 1] Japanese Laid-Open Patent Publication No. 07-22393

[Patent document 2] Japanese Laid-Open Patent Publication No. 62-50978

[Patent document 3] Japanese Laid-Open Patent Publication No. 07-22149

[Patent document 4] Japanese Patent No. 2956524

With the above method, however, when the multi-layer film and the single-layer film are processed concurrently, the processing time becomes long and the productivity is reduced due to the difference in the etching rate between the multi-layer film and the single-layer film.

Also, in plasma etching, it is important to prevent the increase in the temperature of a substrate due to heat input from plasma and to evenly etch a multi-layer film of silicon dioxide and silicon nitride and a single-layer film of silicon dioxide.

SUMMARY OF THE INVENTION

In an aspect of this disclosure, there is provided an etching method performed by an etching apparatus including a first high-frequency power supply and a second high-frequency power supply. The etching method includes a first process of causing the first high-frequency power supply to output a first high-frequency power with a first frequency and causing the second high-frequency power supply to output a second high-frequency power with a second frequency lower than the first frequency in a cryogenic environment where the temperature of a wafer is −35° C. or lower, to generate plasma from a hydrogen-containing gas and a fluorine-containing gas and to etch, with the plasma, a multi-layer film of silicon dioxide and silicon nitride and a single-layer film of silicon dioxide that are formed on the wafer; and a second process of stopping the output of the second high-frequency power supply. The first process and the second process are repeated multiple times, and the first process is shorter in time than the second process.

BRIEF DESCRIPTION OF THE DRAWINGS

FIG. 2 is a drawing illustrating exemplary methods of etching a multi-layer film and a single-layer film under a cryogenic environment;

FIG. 3 is a flowchart illustrating an exemplary intermittent etching process according to a first embodiment;

FIGS. 4A and 4B are drawings illustrating changes in a wafer temperature in an intermittent etching process and a continuous etching process;

FIG. 6 is a flowchart illustrating an exemplary intermittent etching process according to a second embodiment;

DESCRIPTION OF THE PREFERRED EMBODIMENTS

Embodiments of the present invention are described below with reference to the accompanying drawings. Throughout the specification and the drawings, the same reference number is assigned to substantially the same components, and repeated descriptions of those components are omitted.

<<Overall Configuration of Etching Apparatus>>

Figure 1:
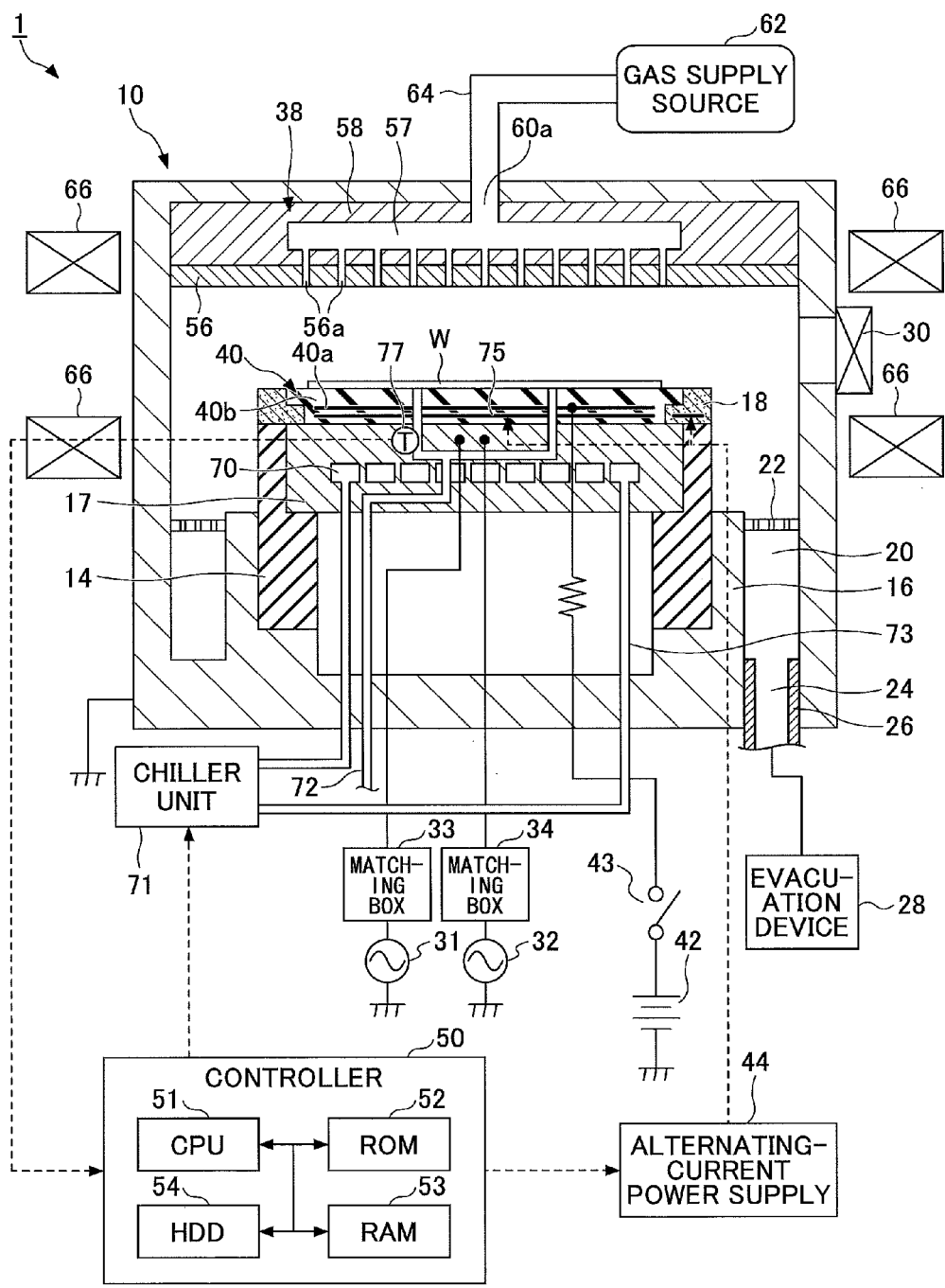
FIG. 1 is a drawing illustrating an exemplary configuration of an etching apparatus.

An exemplary configuration of an etching apparatus 1 according to an embodiment is described with reference to FIG. 1. FIG. 1 is a drawing illustrating an exemplary configuration of the etching apparatus 1.

The etching apparatus 1 includes a cylindrical process chamber 10 comprised of, for example, aluminum whose surface is alumite-treated (or anodized). The process chamber 10 is grounded.

A mount table 17 is provided in the process chamber 10. The mount table 17 is comprised of, for example, aluminum (Al), titanium (Ti), or silicon carbide (SiC), and is supported via a holding part 14 having insulating properties by a support 16. With this configuration, the mount table 17 is disposed on the bottom of the process chamber 10.

An evacuation pipe 26 is provided at the bottom of the process chamber 10, and the evacuation pipe 26 is connected to an evacuation device 28. The evacuation device 28 is implemented by a vacuum pump such as a turbo molecular pump or a dry pump. The evacuation device 28 reduces the pressure of a process space in the process chamber 10 to a predetermined vacuum pressure, and discharges a gas in the process chamber 10 via an evacuation channel 20 and an evacuation port 24. A baffle plate 22 is placed in the evacuation channel 20 to control the flow of the gas.

A gate valve 30 is provided on the side wall of the process chamber 10. A wafer W is carried into and out of the process chamber 10 by opening the gate valve 30.

A first high-frequency power supply 31 for generating plasma is connected via a matching box 33 to the mount table 17. Also, a second high-frequency power supply 32 for attracting ions in the plasma to the wafer W is connected via a matching box 34 to the mount table 17. The first high-frequency power supply 31 applies, to the mount table 17, first high-frequency power HF (high-frequency power for plasma generation) with a first frequency of, for example, 60 MHz, which is suitable to generate plasma in the process chamber 10. The second high-frequency power supply 32 applies, to the mount table 17, second high-frequency power LF (high-frequency power for bias voltage generation) with a second frequency of, for example, 13.56 MHz, which is lower than the first frequency and is suitable to attract ions in the plasma to the wafer W on the mount table 17. For example, the second high-frequency power LF is applied in synchronization with the first high-frequency power HF. Thus, the mount table 17 functions as a table on which the wafer W is placed as well as a lower electrode.

An electrostatic chuck 40 for holding the wafer W with electrostatic attraction is provided on an upper surface of the mount table 17. The electrostatic chuck 40 includes an electrode 40a made of a conductive film and a pair of insulating layers 40b (or insulating sheets) sandwiching the electrode 40a. A direct voltage source 42 is connected via a switch 43 to the electrode 40a. When a voltage from the direct voltage source 42 is applied, the electrostatic chuck 40 attracts and holds the wafer W with Coulomb force. A temperature sensor 77 is provided on the electrostatic chuck 40 to measure the temperature of the electrostatic chuck 40. The temperature sensor 77 can measure the temperature of the wafer 40 on the electrostatic chuck 40.

A focus ring 18 is disposed on the periphery of the electrostatic chuck 40 to surround the mount table 17. The focus ring 18 may be comprised of, for example, silicon or quartz. The focus ring 18 functions to improve the in-plane uniformity of etching.

A gas shower head 38 is provided on the ceiling of the process chamber 10. The gas shower head 38 functions as an upper electrode that is at a ground potential. With this configuration, the first high-frequency power HF from the first high-frequency power supply 31 is applied to a "capacitor" formed between the mount table 17 and the gas shower head 38.

The gas shower head 38 includes an electrode plate 56 having multiple gas holes 56a, and an electrode support 58 that detachably supports the electrode plate 56. A gas supply source 62 supplies a process gas via a gas supply pipe 64 and a gas inlet 60a into the gas shower head 38. The process gas diffuses in a gas diffusion chamber 57, and is introduced via the gas holes 56a into the process chamber 10. Ring-shaped or concentric magnets 66 are disposed around the process chamber 10 to control plasma generated in a plasma generation space between the upper electrode and the lower electrode with a magnetic force.

A heater 75 is embedded in the electrostatic chuck 40. Instead of being embedded in the electrostatic chuck 40, the heater 75 may be attached to the back surface of the electrostatic chuck 40. An electric current output from an alternating-current power supply 44 is supplied via a feeder line to the heater 75. With this configuration, the heater 75 heats the mount table 17.

A refrigerant pipe 70 is formed in the mount table 17. A refrigerant (or brine) supplied from a chiller unit 71 circulates through the refrigerant pipe 70 and a refrigerant circulation pipe 73 to cool the mount table 17.

With the above configuration, the mount table 17 is heated by the heater 75, and is cooled by the brine having a predetermined temperature and flowing through the refrigerant pipe 70 in the mount table 17. This configuration makes it possible to adjust the temperature of the wafer W to a desired value. Also, a heat transfer gas such as a helium (He) gas is supplied via a heat-transfer gas supply line 72 to a space between the upper surface of the electrostatic chuck 40 and the lower surface of the wafer W.

The controller 50 includes a central processing unit (CPU) 51, a read-only memory (ROM) 52, a random access memory (RAM) 53, and a hard disk drive (HDD) 54. The CPU 51 performs etching such as plasma etching according to procedures defined by recipes stored in a storage such as the ROM 52, the RAM 53, or the HDD 54. The storage also stores various types of data such as a data table described later. The controller 50 controls the temperatures of a heating mechanism including the heater 75 and a cooling mechanism using the brine.

When plasma etching is performed, the gate valve 30 is opened, and the wafer W is carried into the process chamber 10 and placed on the electrostatic chuck 40. After the wafer W is carried into the process chamber 10, the gate valve 30 is closed. The pressure in the process chamber 10 is reduced to a preset value by the evacuation device 28. Also, a voltage is applied from the direct voltage source 42 to the electrode 40a of the electrostatic chuck 40 to electrostatically-attract the wafer W to the electrostatic chuck 40.

Next, a gas is introduced via the gas shower head 38 into the process chamber 10 like a shower, and the first high-frequency power HF of a predetermine level for plasma generation is applied to the mount table 17. The introduced gas is ionized and dissociated by the first high-frequency power HF to generate plasma, and plasma etching is performed on the wafer W by the plasma. The second high-frequency power LF for generating a bias voltage may also be applied to the mount table 17. After the plasma etching, the wafer W is carried out of the process chamber 10.

<<Etching Method>>

Next, an exemplary etching method for etching the wafer W with plasma generated by the etching apparatus 1 is described. When a multi-layer film 12 of silicon dioxide and silicon nitride and a single-layer film 13 of silicon dioxide are processed concurrently as illustrated by FIG. 2 (b) and the etching rates (ER) of these films are different from each other, the processing time becomes long and the productivity is reduced.

For the above reason, in an etching method according to an embodiment, in a cryogenic environment where the temperature of the lower electrode (the mount table 17) is less than or equal to −60° C., the etching rates of the multi-layer film 12 and the single-layer film 13 formed on the wafer W are substantially equalized.

The single-layer film 13 of silicon dioxide and the multi-layer film 12 of alternately-stacked silicon dioxide and silicon nitride films are formed on the wafer W, and a mask film 11 is formed on the multi-layer film 12 and the single-layer film 13. The wafer W is, for example, a silicon wafer. The mask film 11 is, for example, a polysilicon film, an organic film, an amorphous carbon film, or a titanium nitride film. The multi-layer film 12 and the single-layer film 13 are etched concurrently via the mask film 11.

FIG. 2 (c) illustrates an exemplary relationship between the etching rate of a silicon dioxide film ($SiO_2$) and the etching rate of a silicon nitride film (SiN) observed in an experiment performed by setting the temperature of the lower electrode between 25° C. and −60° C. The process conditions used in the experiment are described below. Here, the temperature of the lower electrode is synonymous with the set temperature of the chiller unit 71. For example, the temperature of the lower electrode can be set at −60° C. by setting the temperature of the chiller unit 71 at −60° C.

Gas: hydrogen (H$_2$)/carbon tetrafluoride (CF$_4$)

First high-frequency power HF: 2500 W (fixed), continuous wave

Second high-frequency power LF: intermittent (repeatedly turned on and off), 12000 W, pulse wave, duty ratio 40%

As illustrated by FIG. 2 (c), when the temperature of the lower electrode is set between 25° C. and −60° C., the etching rate of the silicon nitride film (SiN) is greater than the etching rate of the silicon dioxide film (SiO$_2$). The etching rate of the silicon nitride film becomes close to the etching rate of the silicon dioxide film when the temperature of the lower electrode is set at a very low temperature near −60° C.

The etching rate of the silicon dioxide film can be further increased by performing intermittent etching where the second high-frequency power LF is repeatedly turned on and off. As illustrated by FIG. 2 (a), by performing the intermittent etching, the etching rate of the single-layer film 13 of silicon dioxide can be made greater than or equal to the etching rate of a silicon nitride film 15.

In an etching method of the present embodiment, the process conditions for the intermittent etching are optimized in performing plasma etching on the multi-layer film 12 and the single-layer film 13. Thus, according to the present embodiment, as illustrated by FIG. 2 (b), when the multi-layer film 12 and the single-layer film 13 are processed concurrently, the etching rates of these films are controlled by using intermittent etching to reduce the processing time and improve the productivity.

First Embodiment

<Etching Process>

An exemplary etching process according to a first embodiment is described with reference to a flowchart of FIG. 3. The etching process of FIG. 3 is controlled by the controller 50 in FIG. 1.

When the etching process of FIG. 3 is started, the controller 50 sets the temperature of a wafer surface at a very low temperature of −35° C. or lower (step S10). For example, the temperature of the wafer surface can be set at −35° C. or lower by setting the temperature of the chiller unit 71 at −60° C. or −70° C.

Next, the controller 50 supplies a hydrogen-containing gas and a fluorine-containing gas into the process chamber 10 (step S12). For example, a hydrogen (H$_2$) gas and a carbon tetrafluoride (CF$_4$) gas, or a gas including these gases is supplied into the process chamber 10.

Next, the controller 50 causes the first high-frequency power supply 31 to output and apply the first high-frequency power HF to the mount table 17. Also, the controller 50 causes the second high-frequency power supply 32 to output and apply the second high-frequency power LF to the mount table 17 (i.e., to turn on the second high-frequency power LF). As a result, the multi-layer film 12 of silicon dioxide and silicon nitride and the single-layer film 13 of silicon dioxide are etched (step S14: first process). In the first process, the first high-frequency power HF and the second high-frequency power LF are continuous waves. The time period (duration) for which the first process is performed is shorter than the time period (duration) for which a second process is performed. For example, the duration of the first process is less than or equal to one third (⅓) of the duration of the second process.

After the first process, the controller 50 performs etching on the multi-layer film 12 and the single-layer film 13 with the output of the second high-frequency power supply 32 stopped (i.e., with the second high-frequency power LF turned off) (step S16: second process). Next, the controller 50 determines whether a repetition count, which indicates the number of times the turning on and off of the second high-frequency power LF is repeated, has reached a predetermined number of times (step S18). The predetermined number of times is greater than or equal to two. When it is determined that the repetition count of the second high-frequency power LF has not reached the predetermined number of times, the controller 50 causes the second high-frequency power supply 32 to output the second high-frequency power LF again (step S20). The duration of step S20 is shorter than the duration of the second process. Then, the controller 50 returns to step S16, and repeats steps S16 through S20 until it is determined at step S18 that the repetition count has reached the predetermined number of times. When it is determined at step S18 that the repetition count of the second high-frequency power LF has reached the predetermined number of times, the controller 50 ends the etching process.

<Results of Etching Process>

Next, exemplary results of the above described etching process of the first embodiment are described with reference to FIGS. 4A and 4B. The process conditions used to obtain the results of FIGS. 4A and 4B were substantially the same as those described above except that the temperature of the lower electrode was set at −70° C.

Figure 4A:
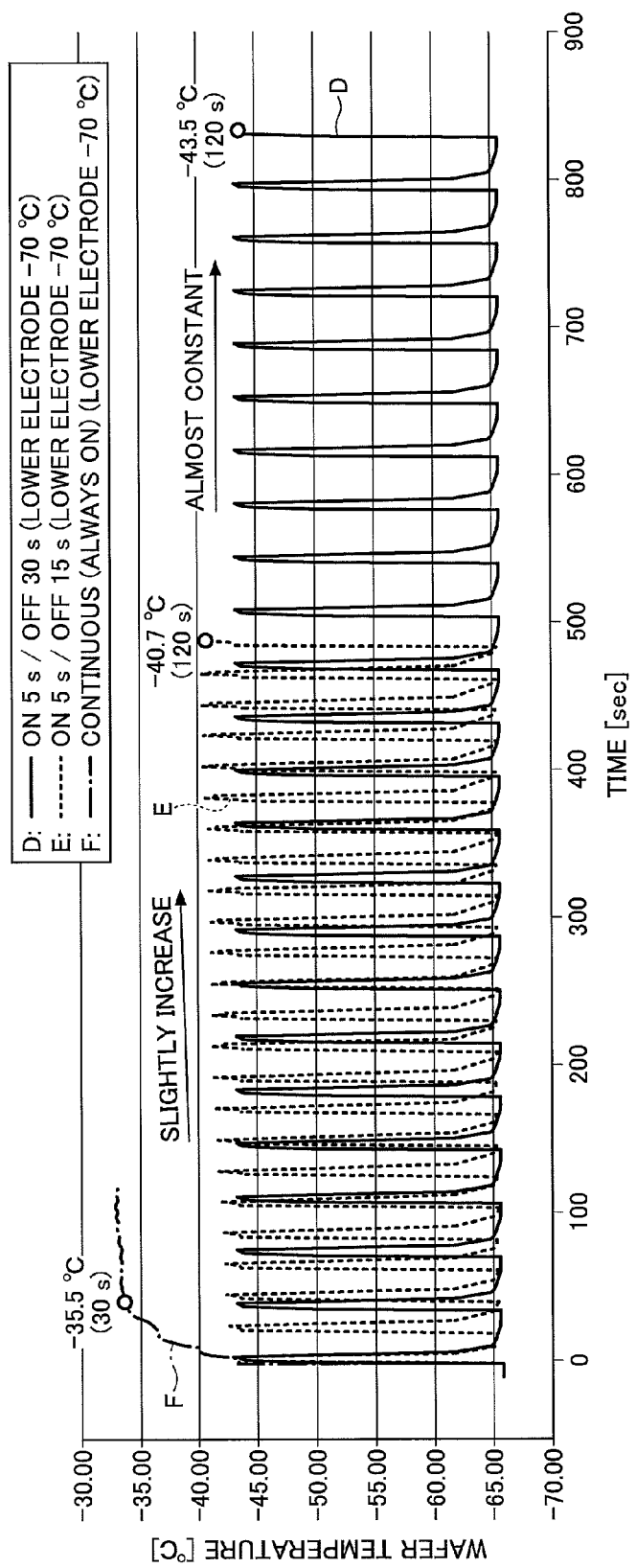

In FIG. 4A, the horizontal axis indicates time and the vertical axis indicates the temperature of the wafer W. The temperature of the wafer W was measured based on reflected light of an infrared laser beam aimed at the wafer W while the lower electrode was cooled to a temperature of −70° C. However, any other known method may also be used to measure the temperature of the wafer W.

A line F indicates a case where the first high-frequency power HF of 2500 W was output as a continuous wave from the first high-frequency power 31 and the second high-frequency power LF of 12000 W was output as a continuous wave from the second high-frequency power supply 32. Because the increase in the wafer temperature varies depending on the amount of heat input from plasma, it is possible to control the wafer temperature by turning on and off the second high-frequency power LF. As a result of continuously outputting the second high-frequency power LF, as indicated by a record No. 1 in FIG. 4B, the temperature of the wafer W indicated by the line F increased to a temperature higher than −35° C. after 30 s from plasma ignition, and increased to −33° C. after 120 s from the plasma ignition. In this case, the difference (temperature increase) in the temperature of the wafer W after 120 s from the plasma ignition is 32° C.

A line E indicates a case where the first high-frequency power HF was set at 2500 W, the second high-frequency power LF was set at 12000 W, an ON time for which the second high-frequency power LF was turned on was set at 5 s, an OFF time for which the second high-frequency power LF was turned off was set at 15 s, and the ON time and the OFF time were repeated 24 times. While the second high-frequency power LF is turned off, the generation of plasma is suppressed, the heat input from the plasma is reduced, and the increase in the wafer temperature is suppressed. As a result, as indicated by a record No. 2 in FIG. 4B, the temperature of the wafer W indicated by the line E was −40.7° C. after 120 s from the plasma ignition, and the wafer W was maintained at a very low temperature of less than −35° C. In this case, the difference (temperature increase) in the temperature of the wafer W after 120 s from the plasma ignition was 24.5° C. Compared with the case (line F) where the second high-frequency power LF was output as a continuous wave, the temperature increase of the wafer W was suppressed. In the case of the line E, however, the temperature of the wafer W slightly increased as illustrated in FIG. 4A. This indicates that the heat input from the plasma to the wafer W was not completely eliminated.

During an etching process, the chiller unit 71 circulated a refrigerant kept at −60° C. or −70° C. through the mount table 17. Accordingly, during an etching process, heat was continuously removed from the surface of the wafer W via the refrigerant circulating through the mount table 17. Because the temperature of the wafer W slightly increased in the case of the line E in spite of the heat removal by the chiller unit 71, it is assumed that the OFF time of the second high-frequency power LF is rather short.

For this reason, in the case of a line D in FIG. 4A, the OFF time of the second high-frequency power LF was increased from 15 s to 30 s. In the case of the line D, the first high-frequency power HF was set at 2500 W, the second high-frequency power LF was set at 12000 W, and an ON time of 5 s and an OFF time of 30 s were repeated 24 times to measure the temperature of the wafer W during the etching process. While the second high-frequency power LF was turned off, the generation of plasma was suppressed, the heat input from the plasma was reduced, and the increase in the wafer temperature was further suppressed. As indicated by a record No. 3 in FIG. 4B, the temperature of the wafer W indicated by the line D was −43.5° C. after 120 s from the plasma ignition, and the wafer W was maintained at a very low temperature of less than −35° C. In this case, the difference (temperature increase) in the temperature of the wafer W after 120 s from the plasma ignition was 21.1° C. Thus, the temperature increase was further suppressed. Thus, in the case of the line D in FIG. 4A, there was no increase in the temperature of the wafer W during the etching process. This indicates that the heat input from the plasma to the wafer W was completely eliminated.

Based on the above results, in the etching method of the present embodiment, intermittent etching is performed by repeatedly turning on and off the second high-frequency power LF for the ON time of 5 s and the OFF time of 30 s. The etching method of the present embodiment makes it possible to maintain the wafer W at a very low temperature of −40° C. or lower, and makes it possible to decrease the peak temperature of the wafer W by about 11° C. compared with an etching method where the second high-frequency power LF is not intermittently applied (i.e., continuously applied). Thus, the etching method of the present embodiment can decrease the peak temperature of the wafer W to a temperature that is lower than the temperature achievable by decreasing the temperature of the refrigerant of the chiller unit 71 by 10° C., and can maintain the wafer W at a low temperature during an etching process. Thus, compared with the case of the line F where the second high-frequency power LF is continuously applied, the amount of heat input to the wafer W during an etching process is greatly reduced.

As described above, unlike an etching method where the second high-frequency power LF is continuously applied, the etching method of the present embodiment makes it possible to decrease the peak temperature of the wafer W and maintain the wafer W at a very low temperature of −35° C. or lower. Accordingly, the etching method of the present embodiment makes it possible to etch the wafer W at a very low temperature of −35° C. or lower, and equalize the etching rates of the multi-layer film and the single-layer film. This in turn makes it possible to increase the etching rates and improve the productivity.

Figure 5A:
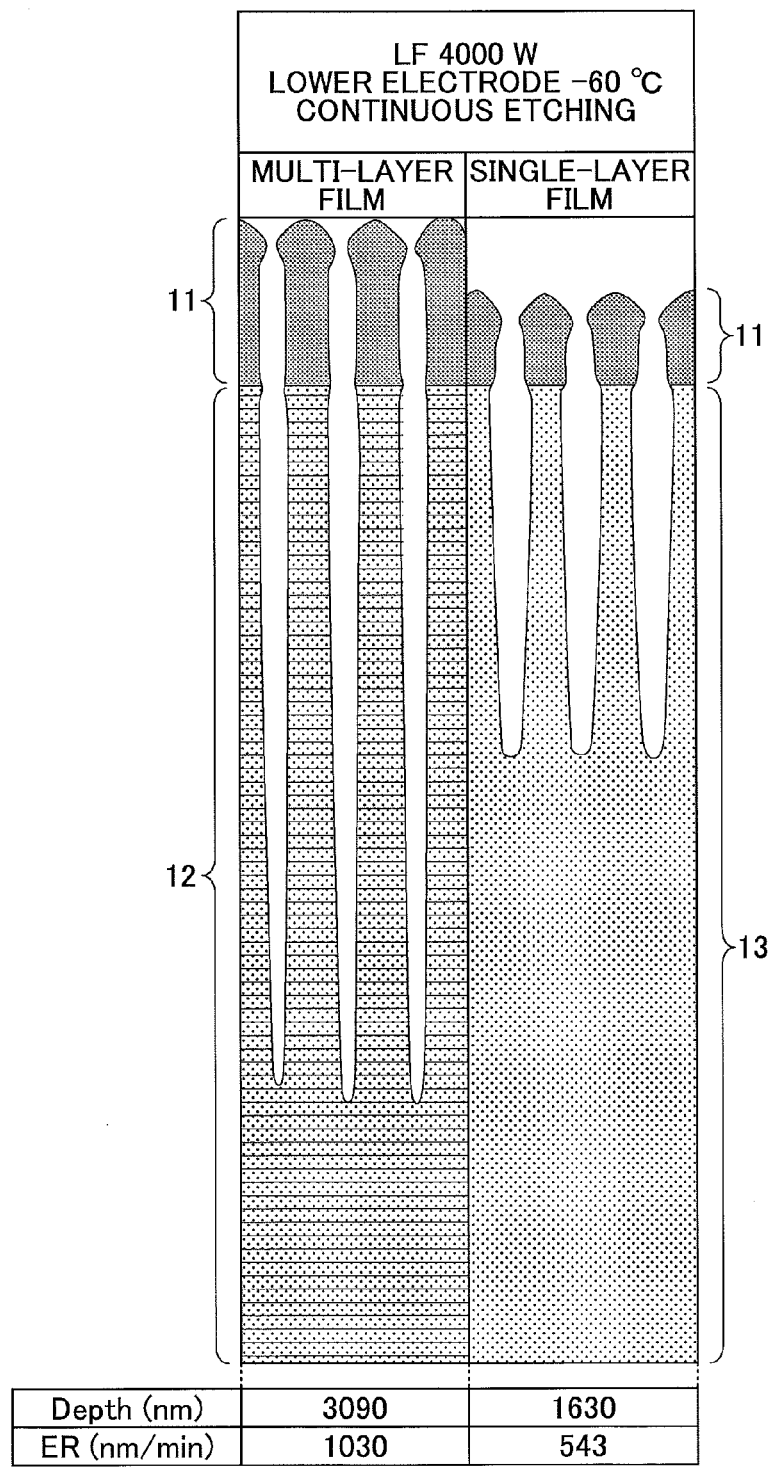
FIGS. 5A through 5C are drawings illustrating the shapes of holes formed by an intermittent etching process and a continuous etching process.
Figure 5B:
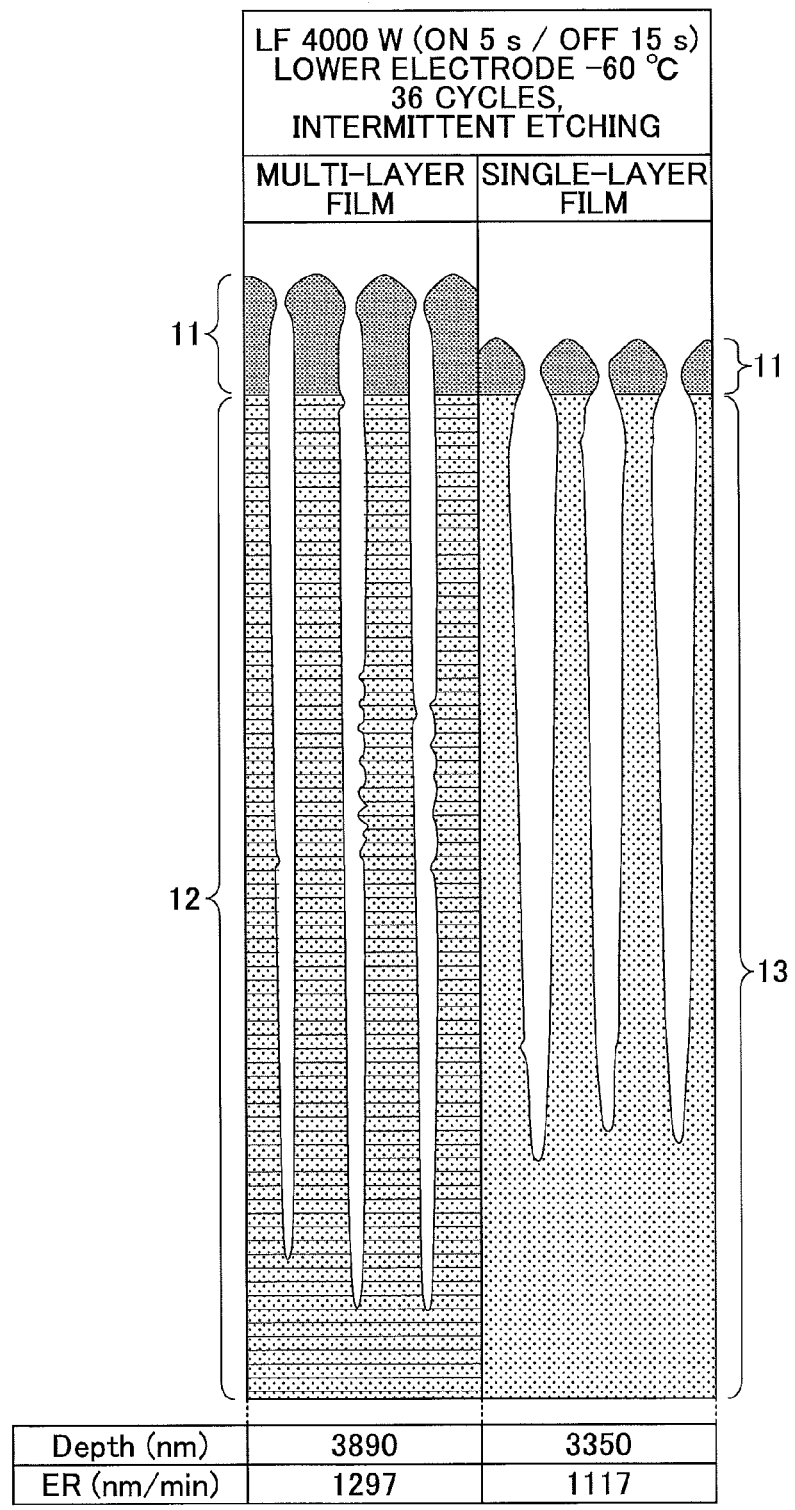
Figure 5C:
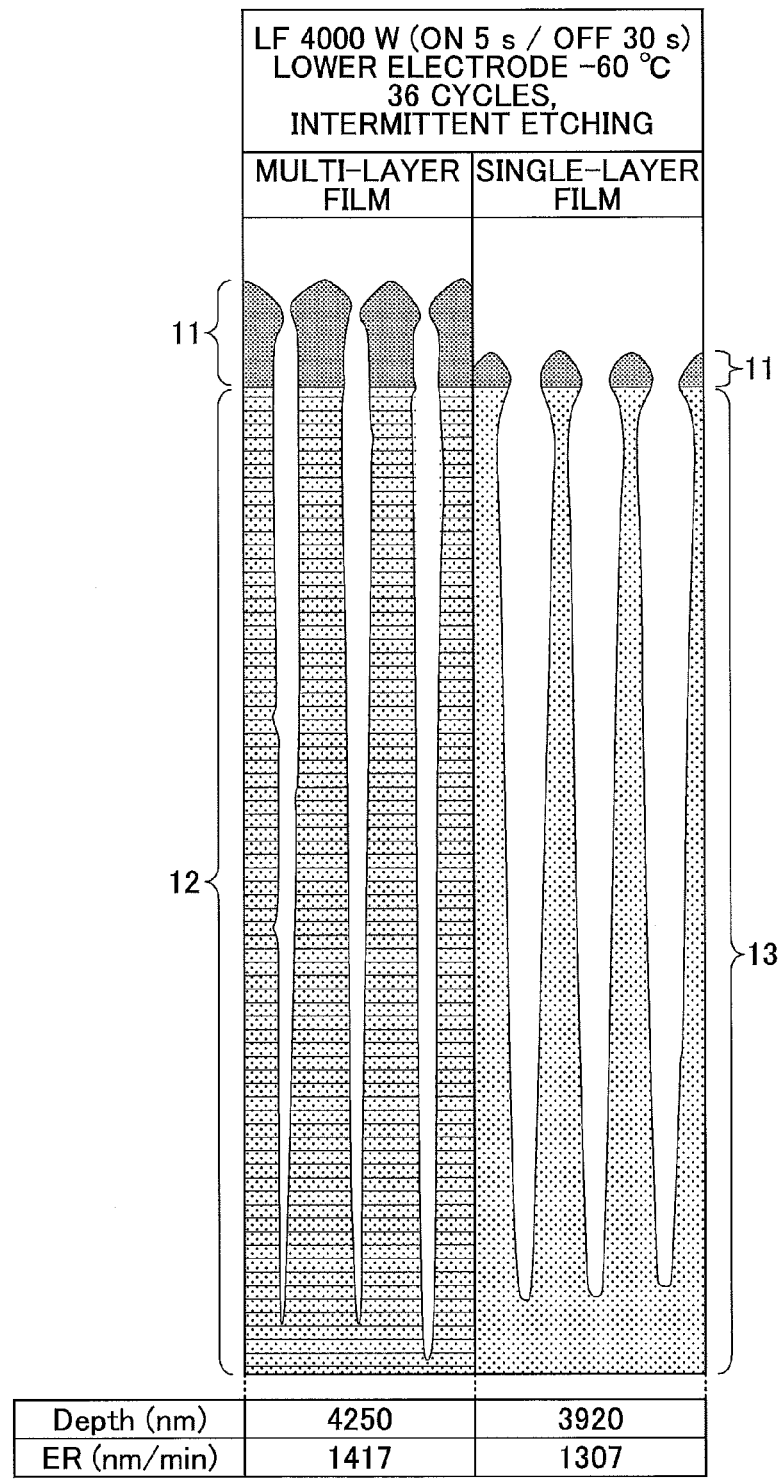

FIGS. 5A through 5C illustrate the results of etching processes performed under the following process conditions.

[Process Conditions]

FIG. 5A: Comparative Example
Lower electrode temperature: −60° C.
Gas: hydrogen ($H_2$)/carbon tetrafluoride ($CF_4$)
First high-frequency power HF: 2500 W, continuous wave
Second high-frequency power LF: 4000 W, continuous wave FIG. 5B: Example of Embodiment
Lower electrode temperature: −60° C.
Gas: hydrogen ($H_2$)/carbon tetrafluoride ($CF_4$)
First high-frequency power HF: 2500 W, continuous wave
Second high-frequency power LF: 4000 W, ON 5 s/OFF 15 s
Repetition count: 36

FIG. 5C: Example of Embodiment
Lower electrode temperature: −60° C.
Gas: hydrogen ($H_2$)/carbon tetrafluoride ($CF_4$)
First high-frequency power HF: 2500 W, continuous wave
Second high-frequency power LF: 4000 W, ON 5 s/OFF 30 s
Repetition count: 36

FIG. 5A corresponds to the case of the line F in FIG. 4A where the second high-frequency power LF was a continuous wave. FIG. 5B corresponds to the case of the line E in FIG. 4A where the second high-frequency power LF was a pulse wave. FIG. 5C corresponds to the case of the line D in FIG. 4A where the second high-frequency power LF was a pulse wave. Each of FIGS. 5A through 5C illustrates cross sections of the multi-layer film 12 and the single-layer film 13 etched according to the corresponding process conditions, the depth of etching, and the etching rate (ER).

In the comparative example of FIG. 5A, the etching rate of the multi-layer film 12 was about two times greater than the etching rate of the single layer film 13. FIGS. 5B and 5C illustrate the results of etching processes performed according to the etching method of the present embodiment where the second high-frequency power LF was repeatedly turned on and off to intermittently apply the second high-frequency power LF. In each of FIGS. 5B and 5C, the etching rate of the single layer film 13 was substantially the same as the etching rate of the multi-layer film 12. The above results indicate that the wafer W can be maintained at a very low temperature of −35° C. or lower by suppressing the generation of plasma and reducing the heat input from the plasma during the OFF time of the second high-frequency power LF. Thus, the etching method of the present embodiment makes it possible to substantially equalize the etching rates of the multi-layer film 12 and the single-layer film 13, to increase the etching rates of the multi-layer film 12 and the single-layer film 13, and to improve the productivity.

In the process conditions, the OFF time of the second high-frequency power LF was longer than the ON time of the second high-frequency power LF. This makes it possible to reduce heat input from plasma and maintain the wafer W at a very low temperature of −35° C. or lower.

In the first embodiment, only the second high-frequency power LF was turned on and off. However, both of the first high-frequency power HF and the second high-frequency power LF may be intermittently applied. In this case, the first high-frequency power HF and the second high-frequency power LF may be turned on and off in synchronization with each other.

Second Embodiment

<Etching Process>

An exemplary etching process according to a second embodiment is described with reference to FIG. 6. The etching process of FIG. 6 is controlled by the controller 50 in FIG. 1.

When the etching process of FIG. 6 is started, the controller 50 sets the temperature of a wafer surface at a very low temperature of −35° C. or lower (step S10). Next, the controller 50 supplies a hydrogen-containing gas and a fluorine-containing gas into the process chamber 10 (step S12). For example, a hydrogen ($H_2$) gas and a carbon tetrafluoride ($CF_4$) gas, or a gas including these gases is supplied into the process chamber 10.

Next, the controller 50 controls the duty ratio of at least one of the first high-frequency power HF and the second high-frequency power LF, causes the first high-frequency power supply 31 to output and apply the first high-frequency power HF to the mount table 17, and causes the second high-frequency power supply 32 to output and apply the second high-frequency power LF to the mount table 17. In the example of FIG. 6, the controller 50 controls the duty ratio of the second high-frequency power LF at 50% or lower, repeats ON and OFF of the second high-frequency power LF at high speed, and outputs the first high-frequency power HF as a continuous wave to etch the multi-layer film 12 and the single-layer film 13 (step S30). After step S30, the controller 50 ends the etching process.

In the etching process of the second embodiment, at least one of the first high-frequency power HF and the second high-frequency power LF is output as a pulse wave at step S30. In the example of FIG. 6, the second high-frequency power LF is output as a pulse wave, Ton indicates the ON time of the second high-frequency power LF, and Toff indicates the OFF time of the second high-frequency power LF. In this case, the frequency of the pulse wave of the second high-frequency power LF is represented by "1/(Ton+ Toff)". Also, the duty ratio is represented by "Ton/(Ton+ Toff)" indicating the percentage of the ON time Ton in the total of the ON time Ton and the OFF time Toff.

Preferably, however, the output of the first high-frequency power supply 31 is also stopped in synchronization with the stop of the output of the second high-frequency power supply 32. In this case, both of the first high-frequency power HF and the second high-frequency power LF are output as pulse waves, and the first high-frequency power HF and the second high-frequency power LF are set at the same duty ratio. Accordingly, the ON time of the first high-frequency power HF and the ON time of the second high-frequency power LF become the same (Ton), and the OFF time of the first high-frequency power HF and the OFF time of the second high-frequency power LF become the same (Toff). This method makes it possible to synchronize the output of the second high-frequency power supply 32 with the output of the first high-frequency power supply 31 at high speed, and makes it possible to synchronize the stop of the output of the second high-frequency power supply 32 with the stop of the output of the first high-frequency power supply 31 at high speed.

Thus, in the etching method of the second embodiment, both of the first high-frequency power HF and the second high-frequency power LF are preferably output as pulse waves. Also, the duty ratio of at least one of the first high-frequency power HF and the second high-frequency power LF is preferably less than or equal to 50% to suppress the heat input from plasma and maintain the wafer W at a very low temperature of −35° C. or lower.

<Results of Etching Process>

Figure 7A:
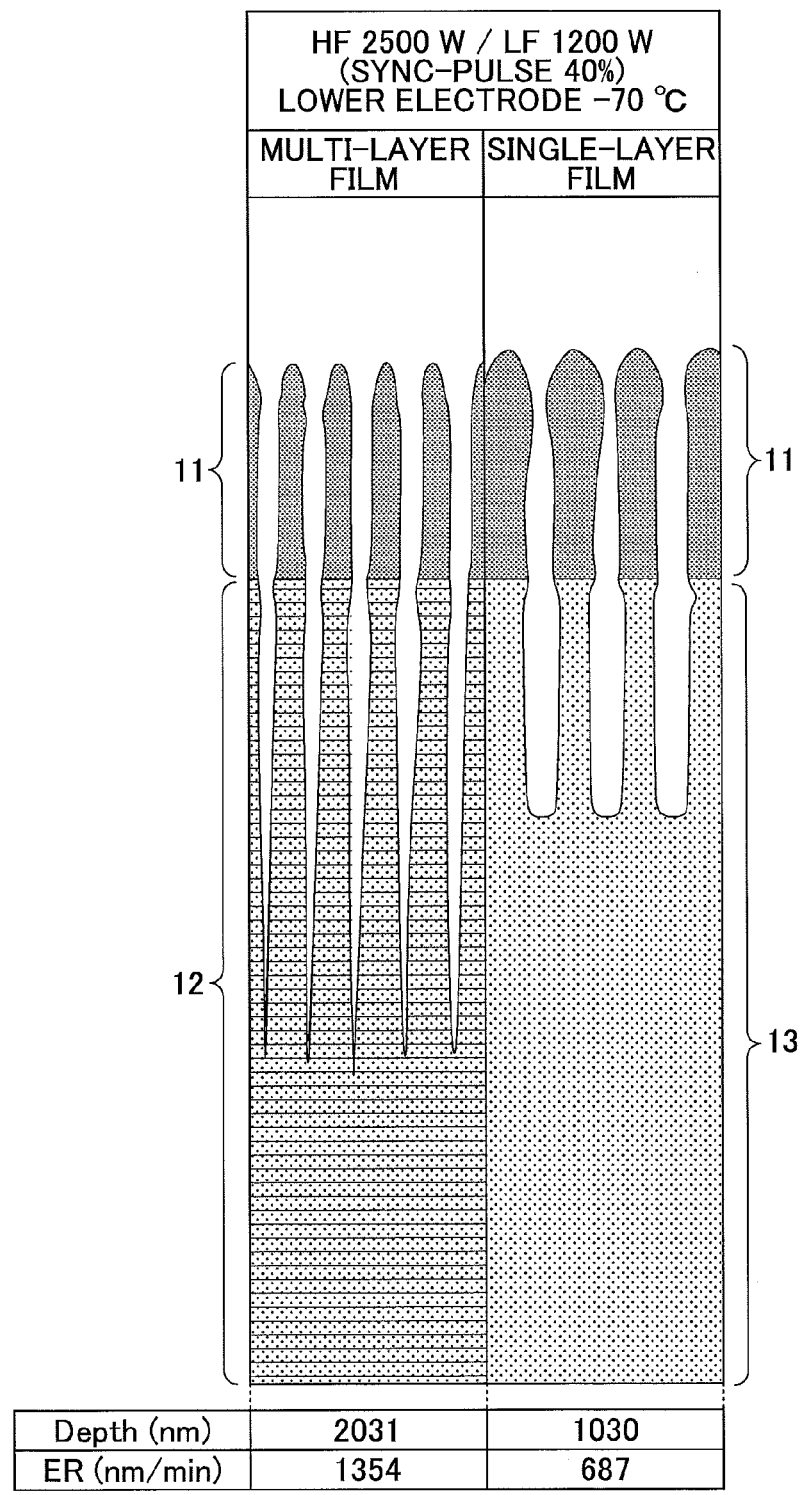
FIGS. 7A through 7C are drawings illustrating the shapes of holes formed by intermittent etching processes with different duty ratios.
Figure 7B:
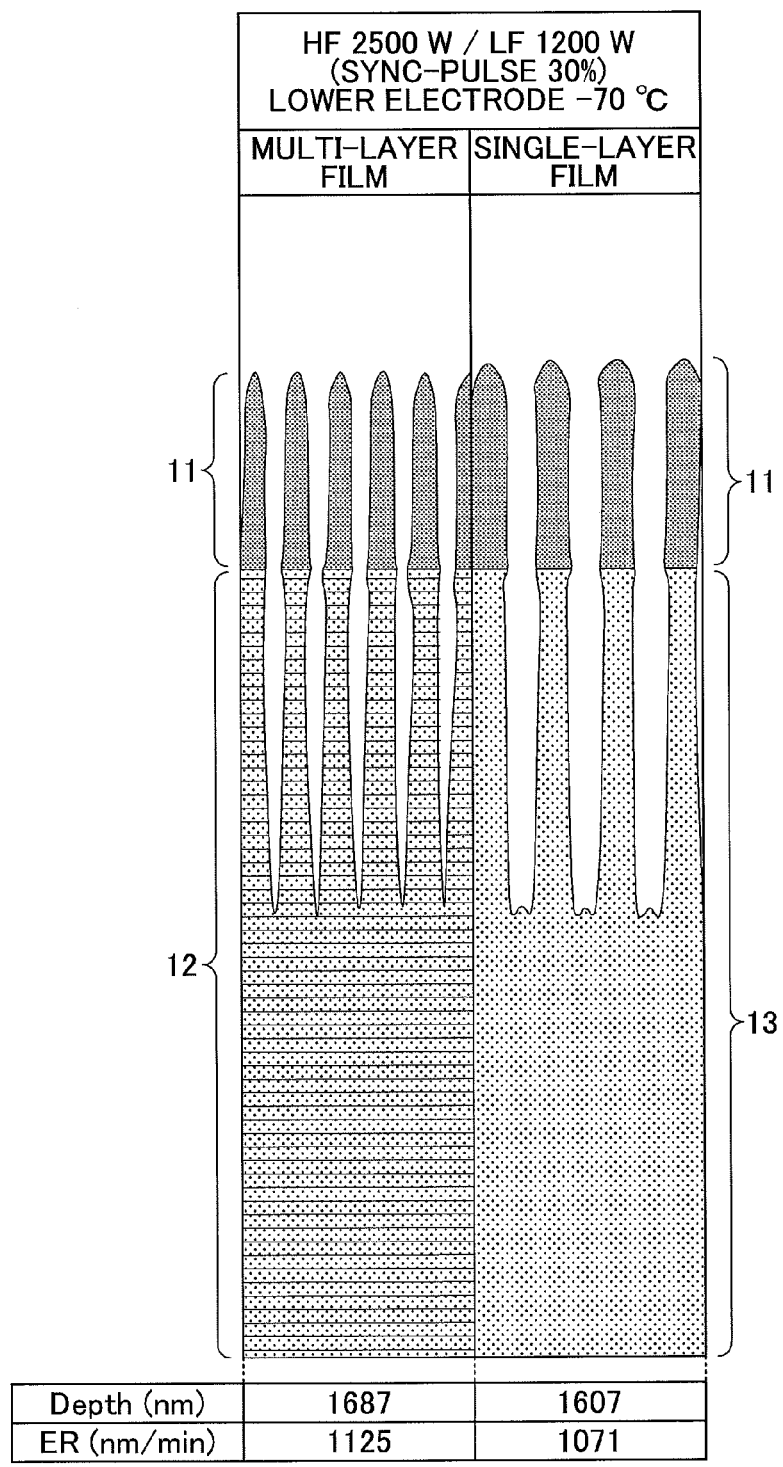
Figure 7C:
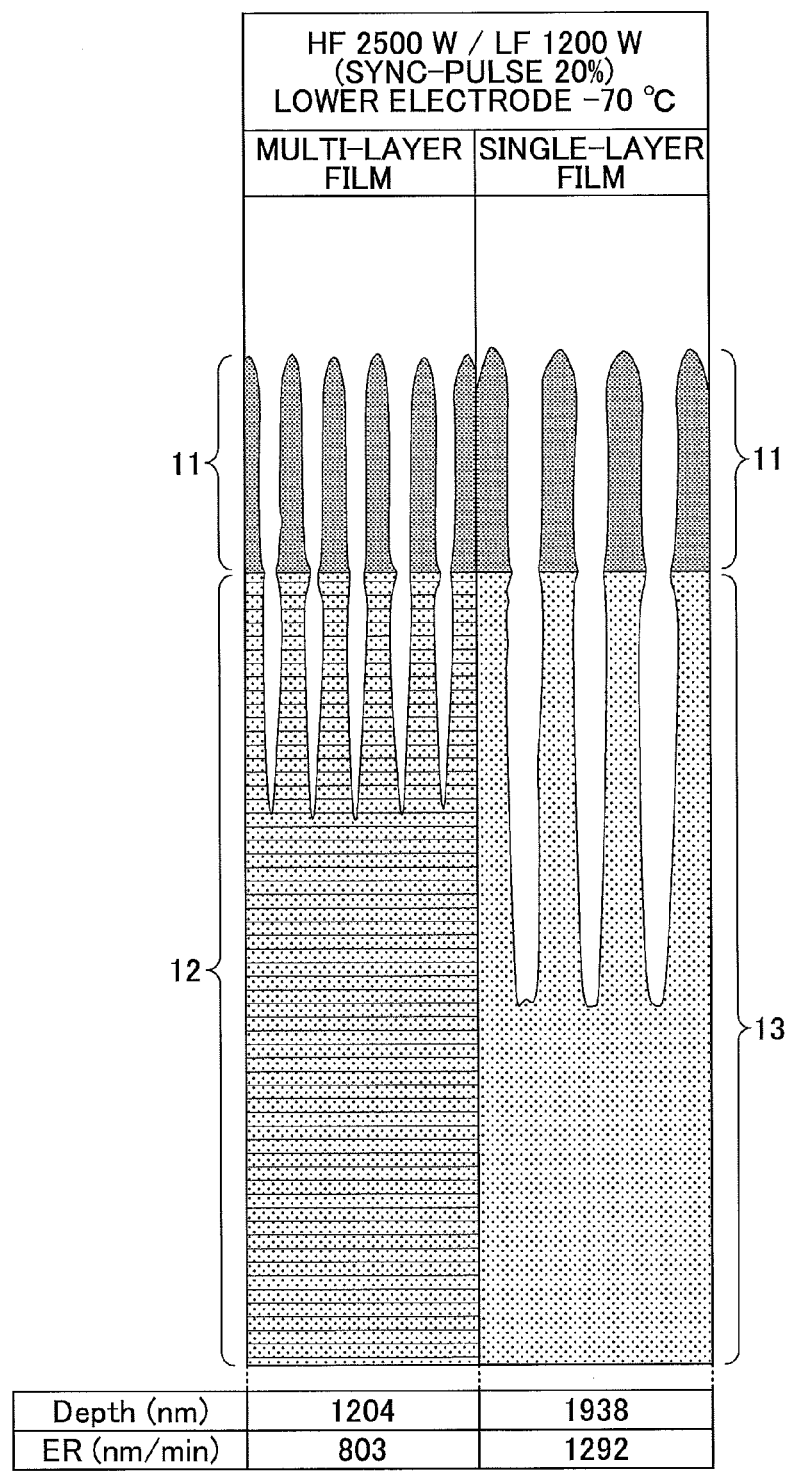

Next, exemplary results of etching processes performed according to the etching method of the second embodiment are described with reference to FIGS. 7A through 7C. In the etching processes of FIGS. 7A through 7C, the temperature of the lower electrode was set at −70° C. FIGS. 7A through 7C illustrate the results of etching processes performed under the following process conditions according to the etching method of the second embodiment.

[Process Conditions]

FIG. 7A: Example of Embodiment
Lower electrode temperature: −70° C.
Gas: hydrogen ($H_2$)/carbon tetrafluoride ($CF_4$)
First high-frequency power HF: 2500 W, pulse wave, duty ratio 40%
(Effective value of first high-frequency power HF: 1000 W)
Second high-frequency power LF: 12000 W, pulse wave, duty ratio 40%
(Effective value of second high-frequency power LF: 4800 W)

FIG. 7B: Example of Embodiment
Lower electrode temperature: −70° C.
Gas: hydrogen ($H_2$)/carbon tetrafluoride ($CF_4$)
First high-frequency power HF: 2500 W, pulse wave, duty ratio 30%
(Effective value of first high-frequency power HF: 750 W)
Second high-frequency power LF: 12000 W, pulse wave, duty ratio 30%
(Effective value of second high-frequency power LF: 3600 W)

FIG. 7C: Example of Embodiment
Lower electrode temperature: −70° C.
Gas: hydrogen ($H_2$)/carbon tetrafluoride ($CF_4$)
First high-frequency power HF: 2500 W, pulse wave, duty ratio 20%
(Effective value of first high-frequency power HF: 500 W)
Second high-frequency power LF: 12000 W, pulse wave, duty ratio 20%
(Effective value of second high-frequency power LF: 2400 W)

As illustrated by FIGS. 7A through 7C, in the etching method of the second embodiment, the etching rates can be controlled by controlling the duty ratios of the first high-frequency power HF and the second high-frequency power LF. As the results indicate, when the duty ratio was set at 30% as in FIG. 7B, the etching rates of the multi-layer film 12 and the single-layer film 13 was closest to each other. Thus, a duty ratio of 30% is suitable to concurrently processing the multi-layer film 12 and the single-layer film 13. When the duty ratio was set at 40% as in FIG. 7A, the etching rate of the multi-layer film 12 was greater than the etching rate of the single-layer film 13. On the other hand, when the duty ratio was set at 20% as in FIG. 7C, the etching rate of the single-layer film 13 was greater than the etching rate of the multi-layer film 12.

The etching method of the second embodiment makes it possible to reduce the heat input from plasma during the OFF time by switching the ON time and the OFF time of each of the first high-frequency power HF and the second high-frequency power LF rapidly. This makes it possible to suppress the temperature increase of the wafer W and maintain the wafer W at a very low temperature of −35° C.

or lower. Particularly, the etching method of the second embodiment makes it possible to substantially equalize the etching rates of the multi-layer film 12 and the single-layer film 13 by controlling the duty ratio. Also, the etching method of the second embodiment makes it possible to increase the etching rates of the multi-layer film 12 and the single-layer film 13 and increase the productivity.

The duty ratios of the first high-frequency power HF and the second high-frequency power LF are preferably less than or equal to 50%. Setting the duty ratios at 50% or lower makes it possible to perform intermittent etching where the ON time (Ton) is shorter than the OFF time (Toff), to reliably maintain the wafer W at a very low temperature of −35° C. or lower, to increase the etching rates of the multi-layer film 12 and the single-layer film 13, and to substantially equalize the etching rates of the multi-layer film 12 and the single-layer film 13.

Also, in the etching method of the second embodiment, the duty ratio of one or both of the first high-frequency power HF and the second high-frequency power LF may be controlled. In either case, the duty ratio of at least one of the first high-frequency power HF and the second high-frequency power LF is preferably set at a value less than or equal to 50%. This makes it possible to maintain the wafer W at a very low temperature of −35° C. or lower, to substantially equalize the etching rates of the multi-layer film 12 and the single-layer film 13, and to increase the etching rates of the multi-layer film 12 and the single-layer film 13.

In the above embodiments, a hydrogen gas is used as an example of the hydrogen-containing gas, and a carbon tetrafluoride gas is used as an example of the fluorine-containing gas. However, the hydrogen-containing gas is not limited to a hydrogen ($H_2$) gas, but may be any gas that includes at least one of a methane ($CH_4$) gas, a fluoromethane ($CH_3F$) gas, a difluoromethane ($CH_2F_2$) gas, and a trifluoromethane ($CHF_3$) gas. Also, the fluorine-containing gas is not limited to a carbon tetrafluoride ($CF_4$) gas, but may be any one of a $C_4F_6$ (hexafluoro-1,3-butadiene) gas, a $C_4F_8$ (perfluorocyclobutane) gas, a $C_3F_8$ (octafluoropropane) gas, a nitrogen trifluoride ($NF_3$) gas, and a $SF_6$ (sulfur hexafluoride) gas.

Third Embodiment

Figure 8A:
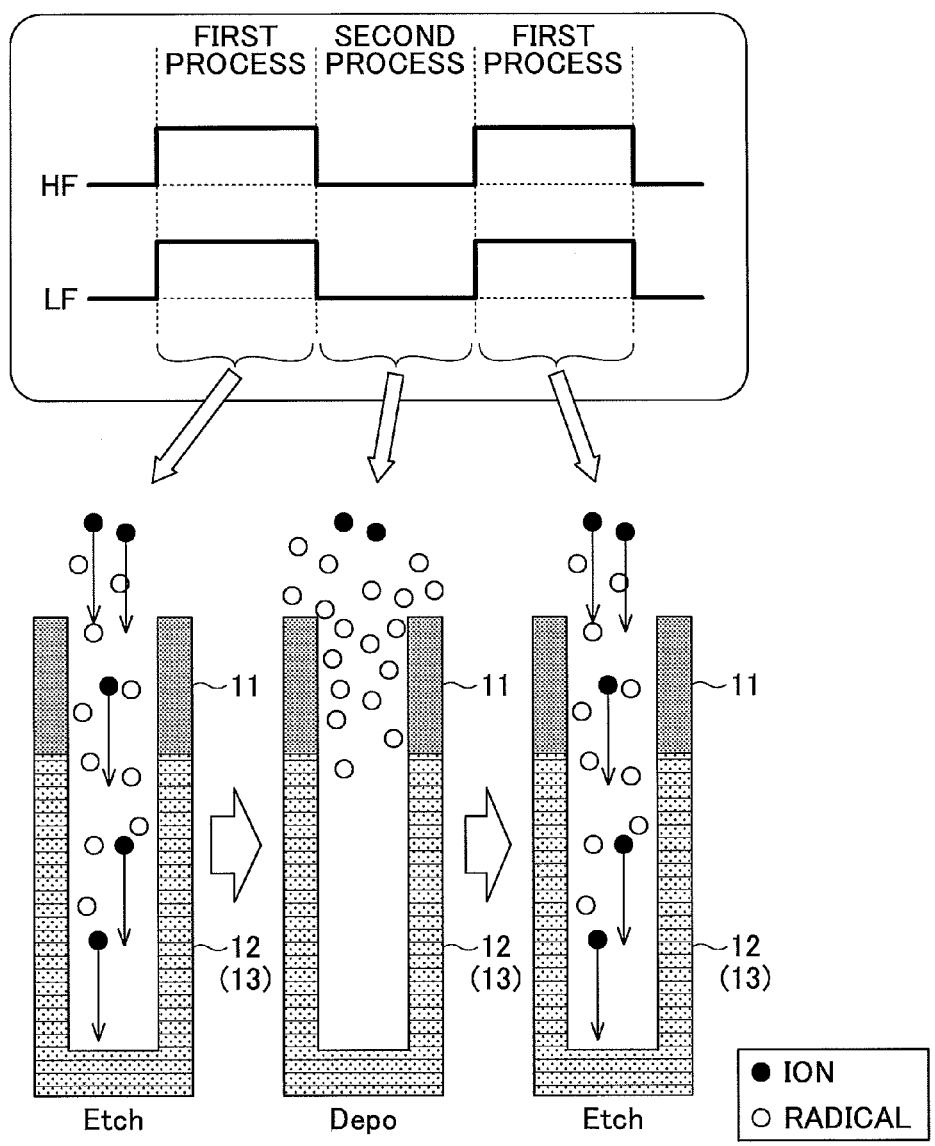
FIGS. 8A and 8B are drawings illustrating etching methods according to a third embodiment.

According to the etching method of the first embodiment, when the first high-frequency power HF and the second high-frequency power LF are intermittently applied, the first high-frequency power HF and the second high-frequency power LF can be turned on and off in synchronization with each other. Also, according to the etching method of the second embodiment, when ON and OFF of the first high-frequency power HF and the second high-frequency power LF are switched at high speed as illustrated in FIG. 8A "sync-pulse", the duty ratios of the pulse waves of the first high-frequency power HF and the second high-frequency power LF are controlled.

Figure 8B:
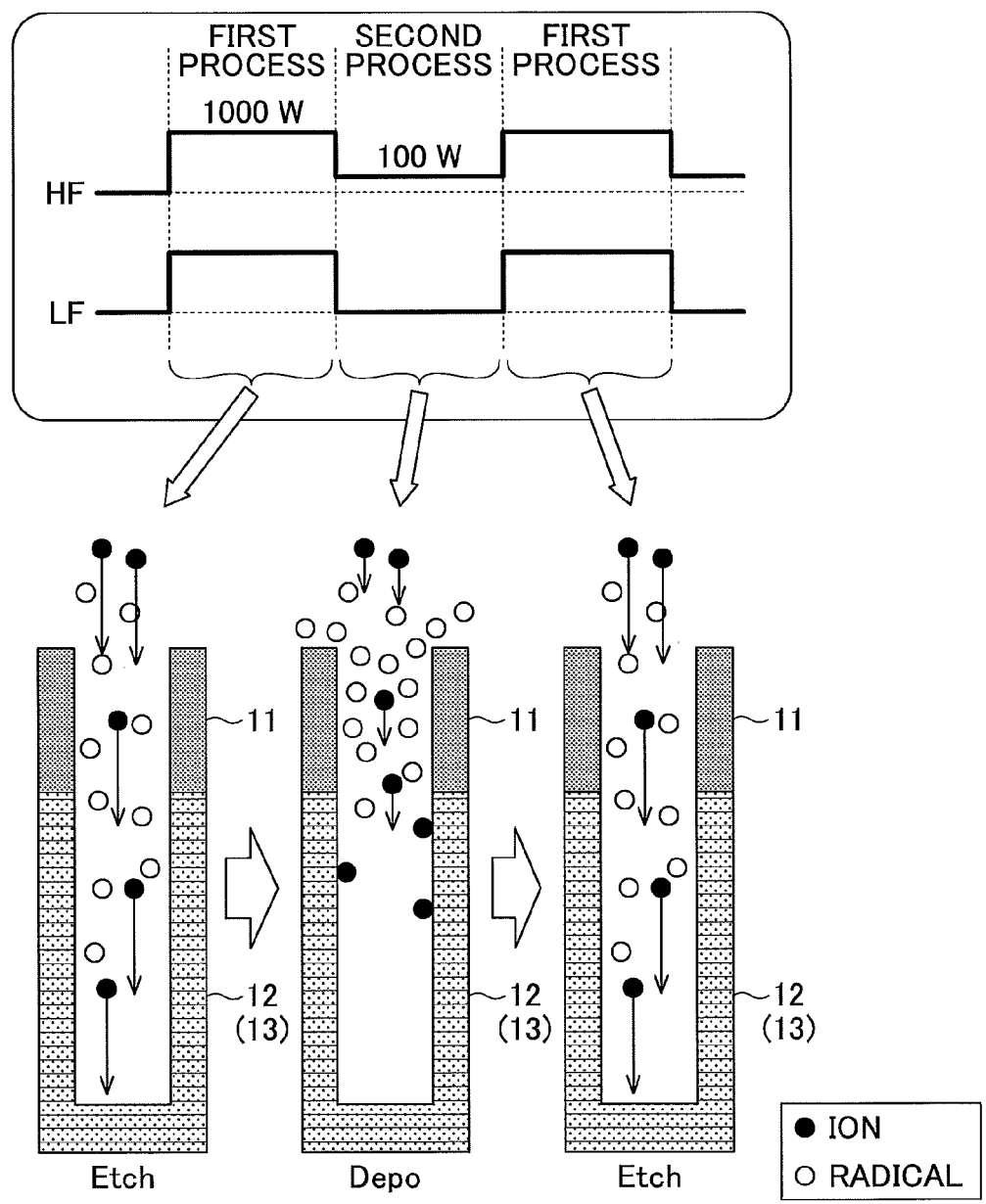

On the other hand, in an etching method according to a third embodiment, instead of completely stopping the output of the first high-frequency power supply 31 in synchronization with the stop of the output of the second high-frequency power supply 32, the output of the first high-frequency power supply 31 is reduced as illustrated by FIG. 8B "advanced-pulse". In the example of FIG. 8B, the output value of the first high-frequency power HF is reduced to 100 W in the second process. However, the reduced output value of the first high-frequency power HF is not limited to 100 W, but may be any value smaller than the output value in the first process.

Thus, in the etching method of the third embodiment, the output of the first high-frequency power supply 31 is reduced in synchronization with the stop of the output of the second high-frequency power supply 32. With this method where the output of the first high-frequency power supply 31 is not completely stopped, plasma is ignited even during the second process in FIG. 8B. For this reason, compared with the second process in FIG. 8A, more anisotropic deposits of ions adhere to the side surface of a hole during the second process in FIG. 8B. Accordingly, compared with the etching methods of the first and second embodiments, the etching method of the third embodiment makes it possible to improve the shape controllability in etching. Also in the third embodiment, the first process and the second process are repeated multiple times, and the first process is shorter in time than the second process.

Figure 9A:
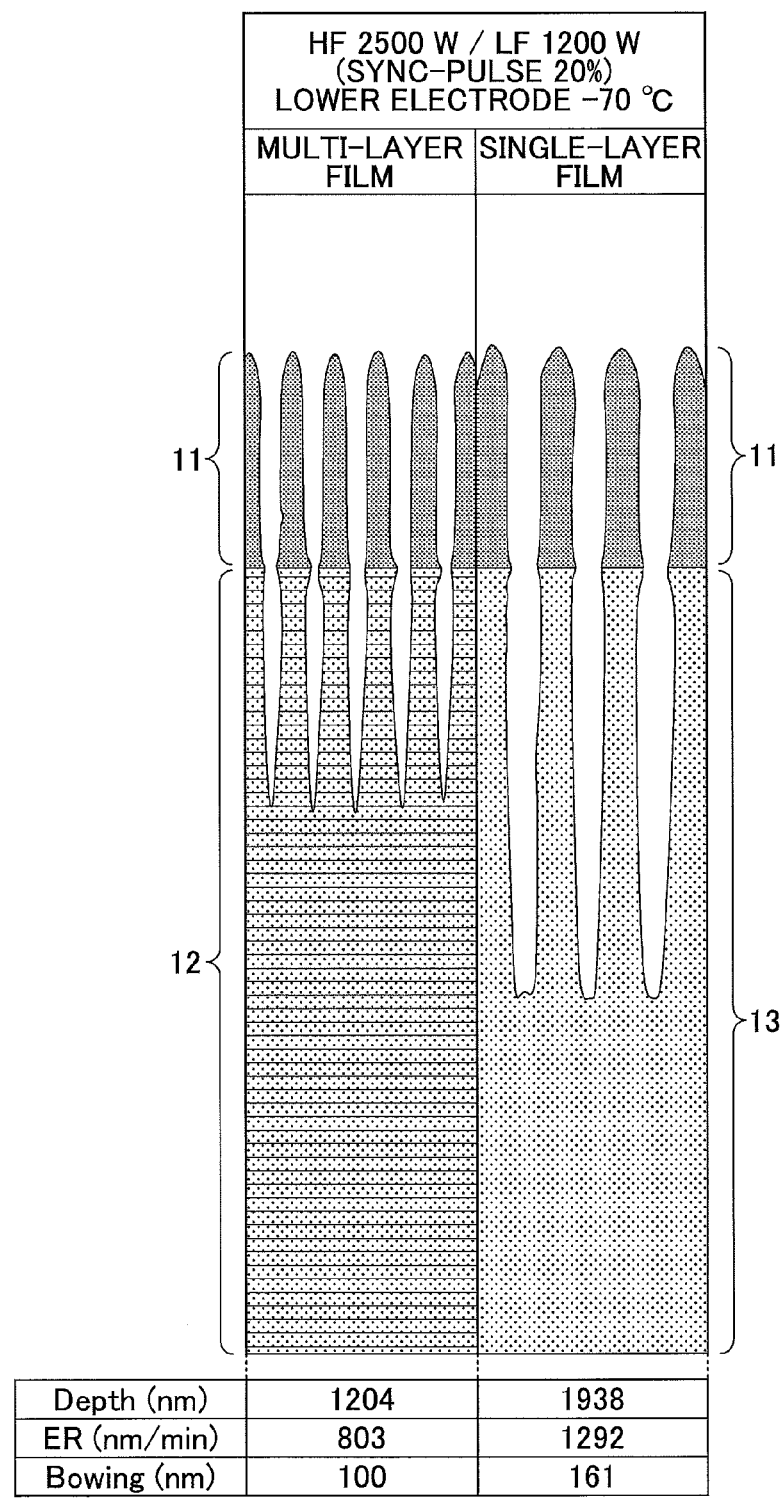
FIGS. 9A and 9B are drawings illustrating the results of etching processes according to the third embodiment.
Figure 9B:
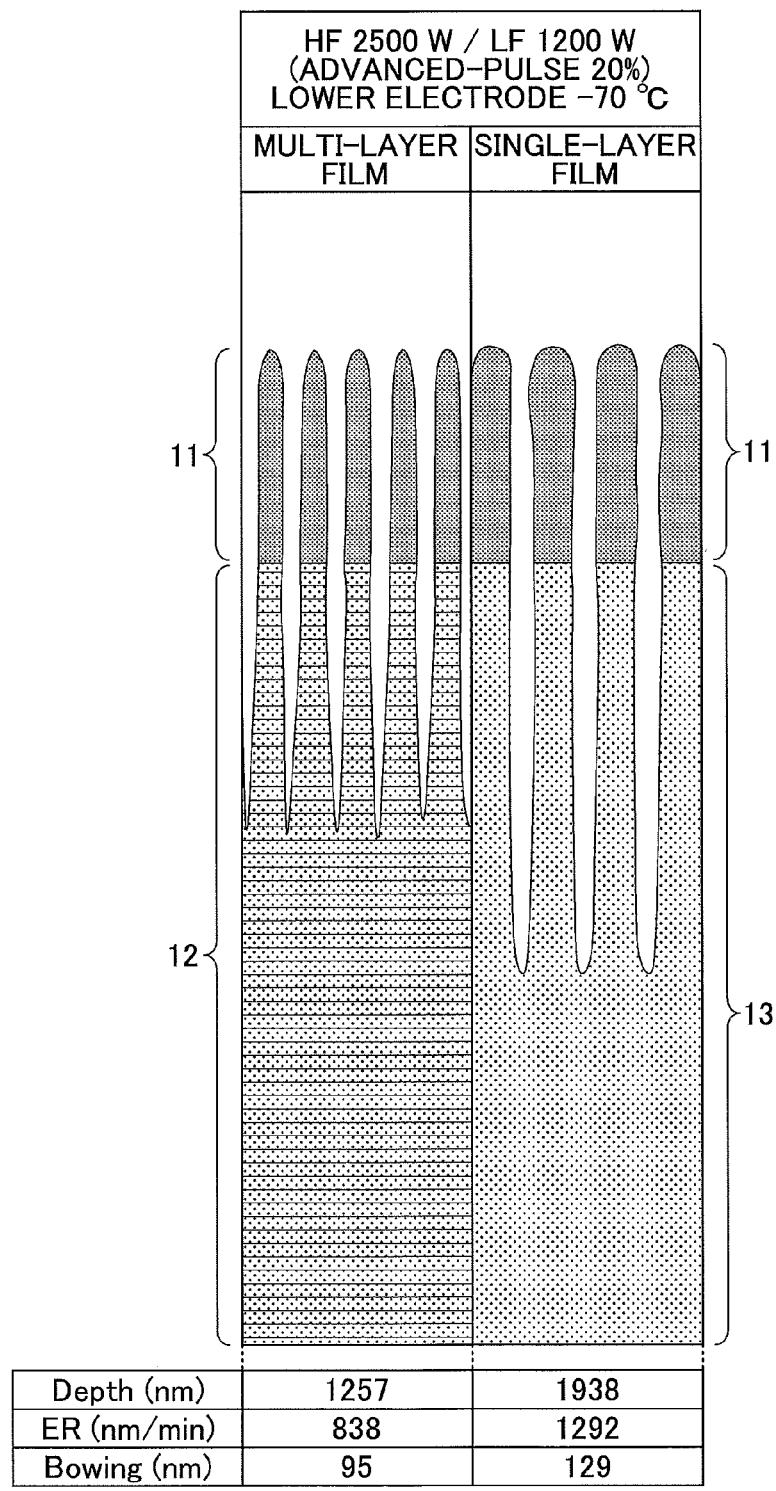

Next, exemplary results of an etching process performed according to the etching method of the third embodiment are described. FIGS. 9A and 9B illustrate the results of etching processes performed under the following process conditions.
[Process Conditions]
  Lower electrode temperature: −70° C.
  Gas: hydrogen ($H_2$)/carbon tetrafluoride ($CF_4$)/trifluoromethane ($CHF_3$)/nitrogen trifluoride ($NF_3$)/perfluorocyclobutane ($C_4F_8$)
  First high-frequency power HF: 2500 W, pulse wave, duty ratio 20%
  (Effective value of first high-frequency power HF: 500 W)
  Second high-frequency power LF: 12000 W, pulse wave, duty ratio 20%
  (Effective value of second high-frequency power LF: 2400 W)

FIG. 9A illustrates holes etched according to the etching method (sync-pulse) of the second embodiment, and is the same as FIG. 7C. FIG. 9B illustrates holes etched according to the etching method (advanced-pulse) of the third embodiment.

In the etching method of the third embodiment, the duty ratios of the first high-frequency power HF and the second high-frequency power LF were controlled, and the output of the first high-frequency power supply 31 was controlled at high speed in synchronization with the stop of the output of the second high-frequency power supply 32 but was not completely stopped. As the results indicate, the etching method of the third embodiment can improve the shape controllability in etching. Also, the results indicate that the etching method of the third embodiment can control the etching rates (ER) and the etching depths similarly to the etching method of the second embodiment.

As described above, with the etching method of the third embodiment where the output of the first high-frequency power supply 31 is reduced but not completely stopped in synchronization with the stop of the output of the second high-frequency power supply 32, it is possible to improve the shape controllability in etching.

In the etching process of FIG. 9B, a mixed gas of hydrogen ($H_2$), carbon tetrafluoride ($CF_4$), trifluoromethane ($CHF_3$), nitrogen trifluoride ($NF_3$), and perfluorocyclobutane ($C_4F_8$) was used. However, various types of a hydrogen-containing gas and a fluorine-containing gas, or a mixed gas including those gases may be used in the etching method of the third embodiment.

Also in the third embodiment, the duration of the first process is preferably less than or equal to one third (⅓) of the duration of the second process. Also, in the etching method of the third embodiment, etching may be performed either by intermittent etching where the first high-frequency power supply 31 and the second high-frequency power supply 32 are turned on and off at intervals of several seconds to several tens of seconds as in the first embodiment or by controlling the duty ratios as in the second embodiment.

For example, the intermittent etching method of the first embodiment may be modified such that in the second process, the output of the first high-frequency power supply 31 is reduced but not completely stopped in synchronization with the stop of the output of the second high-frequency power supply 32 to improve the shape controllability in etching. This method of reducing but not completely stopping the output of the first high-frequency power supply 31 in synchronization with the stop of the output of the second high-frequency power supply 32 may be applied to a case where only the output of the second high-frequency power supply 32 is stopped.

Also, when the second embodiment is applied to the third embodiment, the duty ratios are preferably 50% or lower also in the third embodiment. Also, in this case, the duty ratios of the first high-frequency power HF and the second high-frequency power LF are preferably the same.

Also, in the second process of the third embodiment, a first control process of completely stopping both of the output of the first high-frequency power supply 31 and the output of the second high-frequency power supply 32 may be used in combination with a second control process of reducing but not completely stopping the output of the first high-frequency power supply 31 in synchronization with the stop of the output of the second high-frequency power supply 32.

Further, a direct-current (DC) voltage may be applied to the upper electrode. In this case, the direct-current voltage applied in the second process may be higher than the direct-current voltage applied in the first process.

Etching methods according to the embodiments are described above. However, the present invention is not limited to the specifically disclosed embodiments, and variations and modifications may be made without departing from the scope of the present invention. Also, the embodiments may be combined as long as they do not conflict with each other.

The etching apparatus of the above embodiments may be applied not only to a capacitively-coupled plasma (CCP) apparatus but also to other types of plasma processing apparatuses. Examples of other types of plasma processing apparatuses may include an inductively-coupled plasma (ICP) apparatus, a plasma processing apparatus using a radial line slot antenna, a helicon wave plasma (HWP) apparatus, and an electron cyclotron resonance (ECR) plasma apparatus.

Although the semiconductor wafer W is used as an example of an object to be etched in the above embodiments, the object to be etched is not limited to the wafer W. For example, the etching apparatus and the etching methods of the above embodiments may also be used to etch boards used for a liquid crystal display (LCD) and a flat panel display (FPD), a photomask, a CD substrate, and a printed-circuit board.

An aspect of this disclosure makes it possible to improve the controllability of the temperature of a substrate and the etching uniformity when concurrently etching different types of films.

What is claimed is:

1. An etching method performed by an etching apparatus including a first high-frequency power supply and a second high-frequency power supply, the etching method comprising:
   a first process of causing the first high-frequency power supply to output a first high-frequency power with a first frequency and causing the second high-frequency power supply to output a second high-frequency power with a second frequency lower than the first frequency in a cryogenic environment where a temperature of a wafer is −35° C. or lower, to generate plasma from a hydrogen-containing gas and a fluorine-containing gas and to etch, with the plasma, a multi-layer film of silicon dioxide and silicon nitride and a single-layer film of silicon dioxide that are formed on the wafer; and
   a second process of stopping the output of the second high-frequency power supply, wherein
   the first process and the second process are repeated multiple times; and
   the first process is shorter in time than the second process.

2. The etching method as claimed in claim 1, wherein in the second process, the output of the first high-frequency power supply is also stopped in synchronization with the stopping of the output of the second high-frequency power supply.

3. The etching method as claimed in claim 1, wherein a duration of the first process is less than or equal to one third of a duration of the second process.

4. The etching method as claimed in claim 1, wherein the hydrogen-containing gas is a hydrogen ($H_2$) gas and the fluorine-containing gas is a carbon tetrafluoride ($CF_4$) gas.

5. An etching method performed by an etching apparatus including a first high-frequency power supply and a second high-frequency power supply, the etching method comprising:
   causing the first high-frequency power supply to output a first high-frequency power with a first frequency and causing the second high-frequency power supply to output a second high-frequency power with a second frequency lower than the first frequency in a cryogenic environment where a temperature of a wafer is −35° C. or lower, to generate plasma from a hydrogen-containing gas and a fluorine-containing gas and to etch, with the plasma, a multi-layer film of silicon dioxide and silicon nitride and a single-layer film of silicon dioxide that are formed on the wafer, at least one of the first high-frequency power and the second high-frequency power being a pulse wave; and
   controlling a duty ratio of the pulse wave.

6. The etching method as claimed in claim 5, wherein the duty ratio is less than or equal to 50%.

7. The etching method as claimed in claim 6, wherein
   both of the first high-frequency power and the second high-frequency power are pulse waves; and
   the duty ratio of the first high-frequency power is the same as the duty ratio of the second high-frequency power.

8. The etching method as claimed in claim 5, wherein
   both of the first high-frequency power and the second high-frequency power are pulse waves;
   the duty ratio of the first high-frequency power and the duty ratio of the second high-frequency power are controlled; and the output of the first high-frequency power supply is reduced in synchronization with stopping of the output of the second high-frequency power supply.

9. The etching method as claimed in claim 5, wherein the hydrogen-containing gas is a hydrogen ($H_2$) gas and the fluorine-containing gas is a carbon tetrafluoride ($CF_4$) gas.

10. An etching method performed by an etching apparatus including a first high-frequency power supply and a second high-frequency power supply, the etching method comprising:

a first process of causing the first high-frequency power supply to output a first high-frequency power with a first frequency and causing the second high-frequency power supply to output a second high-frequency power with a second frequency lower than the first frequency in a cryogenic environment where a temperature of a wafer is −35° C. or lower, to generate plasma from a hydrogen-containing gas and a fluorine-containing gas and to etch, with the plasma, a multi-layer film of silicon dioxide and silicon nitride and a single-layer film of silicon dioxide that are formed on the wafer; and a second process of stopping the output of the second high-frequency power supply and reducing the output of the first high-frequency power supply in synchronization with the stopping of the output of the second high-frequency power supply, wherein the first process and the second process are repeated multiple times; and the first process is shorter in time than the second process.

11. The etching method as claimed in claim 10, wherein a duration of the first process is less than or equal to one third of a duration of the second process.

12. The etching method as claimed in claim 10, wherein the hydrogen-containing gas is a hydrogen ($H_2$) gas and the fluorine-containing gas is a carbon tetrafluoride ($CF_4$) gas.

* * * * *